United States Patent [19]

Quinn et al.

[11] Patent Number: 4,518,666
[45] Date of Patent: May 21, 1985

[54] ENLARGEMENT OF PHOTOPOLYMER IMAGES IN PHOTOPOLYMER MASK

[75] Inventors: John A. Quinn, Morganville; James W. O'Neil, Howell, both of N.J.

[73] Assignee: E. I. Du Pont de Nemours and Company, Wilmington, Del.

[21] Appl. No.: 509,702

[22] Filed: Jun. 30, 1983

[51] Int. Cl.$^3$ ................................. G03F 9/00
[52] U.S. Cl. .......................... 430/7; 430/281; 430/309; 430/311; 430/319; 430/322; 430/325
[58] Field of Search .................. 430/5, 6, 325, 326, 430/331, 320, 311, 319, 7, 281, 322, 306, 309, 430/308

[56] References Cited

U.S. PATENT DOCUMENTS

| | | | |
|---|---|---|---|
| 4,094,679 | 6/1978 | Washizawa et al. | 430/325 X |
| 4,173,673 | 11/1979 | Bratt et al. | 428/217 |
| 4,287,277 | 9/1981 | Matsumoto et al. | 430/2 |
| 4,343,876 | 8/1982 | Heiart et al. | 430/5 |

Primary Examiner—John E. Kittle
Assistant Examiner—José G. Dees

[57] ABSTRACT

Process of enlarging image areas covered by a stencil or relief image area formed in a photopolymer mask consisting essentially of (a) contacting said image area with a swelling agent and optionally a diluent to effect enlargement, and (b) removing excess swelling agent, i.e., evaporation, air impingement including heating. Additional image enlargement is possible by further contacting the image with a more concentrated swelling agent. The process is particularly useful in enlarging halftone image dots of photopolymer litho masks wherein the halftone image areas consist of hardened upper skins which rest on softer undervolumes having a lesser degree of polymerization or hardening.

19 Claims, No Drawings

ENLARGEMENT OF PHOTOPOLYMER IMAGES IN PHOTOPOLYMER MASK

DESCRIPTION

1. Technical Field

This invention relates to a process of enlarging the image area in a photopolymer mask. More particularly this invention relates to a process whereby the image enlargement is effected by contacting the image area with a swelling agent therefore, and removing excess swelling agent.

2. Background Art

In the photomechanical arts, a mask containing an image that is opaque to actinic radiation is used as an intermediate or "master" in preparing printing plates. In preparing letterpress or lithographic printing plates, for example, the method of producing the plate is similar. A metal plate coated with a photosensitive resist-forming material is exposed to actinic radiation through the mask. After the exposure, the plate is developed by treatment with a solvent that removes either the exposed or the unexposed material. This leaves a resist image which protects the resist-covered areas of the printing plate from the acid used in etching the plate in the case of letterpress or from the various hydrophilic coatings used in lithography. Relief and lithographic printing plates may also be prepared directly from such masks as disclosed in Plambeck U.S. Pat. No. 2,760,863 and Alles U.S. Pat. No. 3,458,311.

For production of such masks, "litho" (for lithographic) films are preferable, because they employ photosensitive silver halide emulsions which are capable of producing extremely sharp images, i.e., images of high density and contrast. Litho films of this type permit the continuous density variations in the original transparency or image to be rendered as a halftone image consisting of an array of opaque dots of variable sizes or areas and complementary transparent areas. Such processes of forming litho masks are described in Chapter IV of "The Printing Industry" by Victor Strauss, published by Printing Industries of America (1967). The tonal characteristics of the image (tone referring to gradations within a color hue) are determined by the dot size, i.e., the percent of the surface area in any small region covered by halftone dots. Reducing or enlarging this percent by reducing or enlarging the area of the halftone dots thereby changes the tone values of the image. This principle is widely applied in lithography, and is important in correcting color work. It thus permits tone values or color strength to be changed during the photographic steps rather than on the printing plate.

In one method of producing a mask with a litho film, it is exposed through a vignetted halftone screen and a continuous tone image transparency and then developed, thereby forming a halftone image consisting of an array of opaque dots on completely transparent areas.

It is known to effect dot size reduction, or dot etching, with conventional silver halide litho film by treating the film area with an oxidant for the silver in the dot image, but there is no similar direct method for enlarging such dots. One method of dot enlargement entails touch-up of a continuous-tone transparency by manually adding density, e.g., with an air brush or pen and ink, and then producing a completely new halftone mask therefrom. A second method of dot enlargement is to produce a halftone negative of the original halftone mask, dot etch the negative, and from the dot-etched negative produce a second halftone mask which is then a reproduction of the original mask but with enlarged dots. Both of these methods are expensive and time consuming.

It is also known to effect dot size reduction, or "dot etching", in photopolymer lithographic masks; this is described in Bratt and Cohen U.S. Pat. No. 4,173,673. In addition to the methods used for silver halide masks, dot enlargement of photopolymer masks has also been achieved by three other methods: (1) by a burnishing technique, (2) by treating the film area with a solution of a swelling agent and a fatty acid, followed by stabilizing the swollen dot image by treatment with an aqueous solution so as to precipitate the salt of the acid within the matrix, and (3) by contacting the image area of a polymeric relief image containing crosslinkable moieties with a solution containing a swelling agent to effect image enlargement, and a crosslinking agent to react with and link the crosslinkable moieties of said polymeric relief image, whereby the image is enlarged and is fixed in its enlarged state as described in Heiart and O'Neil U.S. Pat. No. 4,343,876.

It has been found that the burnishing, method (1) supra, is useful only for small areas where uniformity is not critical. Treatment of the film area with a solution of a swelling agent and a fatty acid and stabilizing the swollen dot, method (2) supra, results in the swollen image shrinking partially over a period of time. Method (3) supra, disclosed in U.S. Pat. No. 4,343,876 is an improvement over methods (1) and (2). Crosslinking agents are used to irreversibly enlarge halftone dots. No further enlargement of the already enlarged dot can be accomplished with this method, however. In addition, some crosslinking agents can impart an undesirable coloration to a treated image. There is a need for an improved method of changing the tonal values of photopolymer masks by image enlargement which is uniform, irreversible and is not subject to undesired coloration. There is also a need for a method of image enlargement whereby the already enlarged image can be further enlarged.

DISCLOSURE OF THE INVENTION

In accordance with this invention there is provided a process of enlarging the image area covered by a stencil or relief image area formed in a photopolymer mask which process consists essentially of (a) contacting the image area with a swelling agent therefor to effect an equilibrated image enlargement, and (b) removing excess swelling agent whereby the equilibrated image is fixed in its enlarged state.

By stencil or relief image area formed in the polymer mask is meant a three-dimensional raised image such as a printing plate or resist image. A stencil image more particularly describes those voids or channels defined and bounded by a thin relief, e.g., an image formed by a resist. In either case, however, the dimension most affected by the enlargement process is the area covered by the relief rather than its thickness. The polymer mask referred to above is a photopolymerized mask. The process is particularly useful in enlarging the halftone image dot area of photopolymer litho masks wherein the halftone image areas consist of hardened upper skins which rest on softer undervolumes having a lesser degree of polymerization or hardening.

For the process to be useful, the photopolymer mask which is formed by the stencil or relief image must be capable of being swollen to effect an equilibrated image enlargement. The term "equilibrated image enlargement" means that the enlarged image is in a state of balance, i.e., it is static and will not shrink or further enlarge at ambient conditions after removal of excess swelling agent. A further equilibrated image enlargement can be obtained, however, by contacting the enlarged image area at least one more time with a swelling agent therefor and removing excess swelling agent, the swelling agent being more concentrated than in the preceding contacting step. It is believed to be surprising that permanent enlargement of photopolymer image can be achieved without the need for a separate crosslinking agent in combination with the swelling agent.

The image enlarging process of this invention can be used on diverse polymeric relief or stencil images such as those disclosed in Bratt and Cohen U.S. Pat. No. 4,173,673, Dueber U.S. Pat. No. 4,162,162, Roos U.S. Pat. No. 4,126,466, Pazos U.S. Pat. No. 4,198,242, Cohen and Fan U.S. Pat. No. 4,191,572, and Flint and Pilette U.S. Pat. No. 4,293,635, all of which are incorporated herein by reference.

This invention is particularly related to the subject matter of aforementioned U.S. Pat. No. 4,173,673, "Dot-Etchable Mask from Photopolymerizable Elements". That patent is directed to a halftone image mask comprising a transparent support bearing a tone-correctable image composed of polymeric dots with an optical density of 3.0, which can be dot-etched, i.e., the dots reduced in size or area by solvent edge-undercutting followed by mechanical action, e.g., by rubbing, brushing, or spraying. The present invention proceeds in the opposite direction. Instead of reducing the size or area of the halftone dots, the present invention is directed to increasing their size or area, and effecting an equilibrated image enlargement.

A mask suitable for contact speed lithographic work is readily provided by imagewise exposing to actinic radiation through a halftone image a layer of a photopolymerizable composition coated upon a transparent support film, and then developing by washing out the unexposed areas to leave a suitable dot image mask on the support film. Dyes or pigments, e.g., colloidal carbon, may be added to the photopolymerizable layer beforehand, so that the photopolymer image will be opaque in both the ultraviolet and visible regions of the spectrum. The photopolymerizable composition, typically, will consist essentially of:

(a) an ethylenically unsaturated monomer capable of forming a high molecular weight polymer by free radical-initiated, chain-propagating, addition polymerization, 10–30% by weight,
(b) a polymeric binder, 10–60% by weight,
(c) a free radical-generating addition polymerization initiator system activatable by actinic radiation, 0.1–20% by weight, and,
(d) an actinic radiation-absorber, present in such concentration as to impart an optical density to the photopolymerizable layer of at least 3.0 over at least the spectral range of 350–400 nm.

The makeup of components a, b, c, and d is described in detail in U.S. Pat. No. 4,173,673, supra, incorporated by reference, particularly at columns 5–9 thereof.

A wide variety of polymeric binders may be used, such as are disclosed in prior art photopolymerizable compositions. Where development is desired in predominantly aqueous solutions, e.g., dilute aqueous alkaline solutions, typically the polymeric binders which satisfy these criteria are carboxylated, e.g., vinyl addition polymers containing free carboxyl groups. The binder containing material should become relatively insoluble in the particular developer used upon exposure to actinic radiation.

Once a layer of the photopolymerizable composition has been coated on a suitable film support and dried, a protective overcoat layer or removable cover sheet may be laminated to the surface thereof. The photopolymerizable composition is preferably coated to give a dry coating thickness of about 0.0002 inch (50 mg/dm$^2$). A suitable film support may be selected from a wide variety of high molecular weight polymer films, e.g., polyamides, polyolefins, polyesters, vinyl polymers, and cellulose esters, and have a thickness of from 0.00025 inch (0.006 mm) to 0.008 inch (0.203 mm) or more. If exposure is to be through the support and before removing the support film, e.g., when used as a photoresist, the latter must, of course, transmit a substantial fraction of the actinic radiation incident upon it. If the support film is removed prior to exposure, no such restrictions apply. If the support is to remain on the photopolymer layer, as in the case of a litho mask, it must be transparent. A particularly suitable film is a transparent polyethylene terephthalate film having a thickness of about 0.004 inch (0.102 mm).

Suitable removable cover sheets may be chosen from the same group of high polymer films described above and can have the same wide range of thicknesses. Where exposure is to be through the cover sheet or layer, it must be transparent to actinic radiation. A cover sheet of 0.0005 inch thick (0.013 mm) polyethylene terephthalate is especially suitable. The support and/or the cover film may have other layers thereon as desired, e.g., adhesive sublayers, release layers, antistatic and matte layers, etc. A developer-soluble oxygen barrier layer such as described in Fan U.S. Pat. No. 4,072,527, Bratt U.S. Pat. No. 4,072,528 and Alles U.S. Pat. No. 3,458,311 may be incorporated on the surface of the photopolymerizable layer in place of or in addition to the cover sheet.

In carrying out the exposure step, the supported photopolymerizable composition, prepared as described, is preferably exposed to actinic radiation from a light source, rich in ultraviolet radiation through a halftone image transparency, i.e., an image-bearing transparency consisting solely of opaque and transparent areas, wherein the opaque areas are substantially of the same optical density. However, exposure may also be through a vignetted halftone or line screen in combination or in sequence with a continuous tone image transparency. If the transparency is an engineering drawing or printed circuit pattern the image will be a line image. Any conventional radiation source may be employed so long as it provides ultraviolet radiation, e.g., a carbon arc, a xenon arc, a mercury vapor arc, fluorescent lamps, electronic flash units and photographic flood lamps, etc.

After exposure, the element is developed by washing out with a suitable developer solvent the unexposed, unhardened, soluble portions of the photopolymerizable layer on the side that was exposed. Such solvents are well-known in the art and require no disclosure here. They are applied in various ways, as by impingement of spray jets, agitated immersion, brushing or scrubbing, to leave the desired colored, hardened, insoluble image. The result is a tone-correctable resist image which has sufficient opacity in the actinic region to be used as a mask for further exposing photosensitive compositions.

Stencil or relief image masks useful with the dot enlargement process may also be prepared from other elements using other processes. Development may be by a peel-apart procedure such as in Colgrove U.S. Pat. No. 3,353,955 or by a peel-apart, solvent-washout combined procedure as described for multilayer elements in Cohen and Fan U.S. Pat. No. 4,191,572, supra. Similarly, multilayer elements using washout development alone are disclosed in Roos U.S. Pat. No. 4,126,466, supra. Duplicate image masks may be prepared from elements containing o-nitro aromatic photoinhibitors using a double-exposure process, described in Pazos U.S. Pat. No. 4,198,242, supra. Polymeric masks containing amphoteric polymeric components are disclosed in Flint and Pilette U.S. Pat. No. 4,293,635. For the masks exemplified by these patents to be useful in the process of the invention, they must comprise a swellable polymeric stencil or relief image which when any excess swelling agent is removed the image is static in its enlarged state.

The resist or stencil image, for example, in the form of opaque polymeric dots as prepared above, could be used as a mask directly, but in accordance with the process of this invention is given an image swelling treatment. The dot-enlargement process is carried out by applying to the halftone dots in the polymeric mask at least one swelling agent, e.g., glycol alkyl ethers, alcohols, ketones, esters, etc. Use of one or more swelling agents is generally all that is required to effect the equilibrated image enlargement. Diluents, e.g., water, hydrocarbon solvents, can be present, however, to decrease the concentration of the swelling agent. Diluents are "inert solvents" which when they are applied alone to the image surface, have substantially no effect on the image size. Additional treatment of the enlarged image with a more concentrated swelling agent has been found to further enlarge the image. An increase in image size of from about 1 to about 30% has been achieved by the invention. The ratio of swelling agent to diluent ranges from 10/90 to 100/0. The excess swelling agent that may be present is removed from the image areas by known means. Normal evaporation or speeded evaporation by air impingement using air at ambient temperature or elevated temperature are useful in removing excess swelling agent. The swelling agent present on the enlarged image surface may also be removed by treating with diluent nonswelling agent.

Swelling agents useful in this invention include: glycol alkyl ethers, e.g., 2-methoxyethanol, 2-ethoxyethanol and 2-butoxyethanol; alcohols, e.g., methanol, ethanol, butanol, isopropanol; ketones, e.g., acetone, methyl ethyl ketone, cyclohexanone, etc.; esters, e.g., ethyl acetate, etc.; as well as other swelling agents.

Diluents that may be present with the aforementioned swelling agents include: water, inert hydrocarbon solvent, e.g., Soltrol ®50, a mixture of $C_{8-10}$ isoparaffins with a boiling point range of 116°–149° C., a product of Philips Petroleum; hexane, cyclohexane, heptane, 1,2-dichloroethane, trichlorotrifluoroethane, etc.

It is preferred that the swelling materials not be too active so that the rate of swelling is too great, particularly swelling occurring upon application of the material which may result in some image damage by the mechanical action of the applicator. In fact, it is desirable that little or no swelling occur until the swelling agent or combination of swelling agent and diluent be present on the image surface for about 10 seconds or more. Diluents with high boiling points, e.g., above about 150° C., and low volatility, while they may cause some initial dot swelling, upon drying the image reverts to its original size, e.g., ethylene glycol and butyl diglycol carbonate. 2-Butoxyethanol is a preferred swelling agent. The diluents which give permanent dot enlargement, e.g., with 2-butoxyethanol, are volatile and have relatively low boiling points, e.g., less than 150° C., preferably in the range of 70° to 100° C. 2-Butoxyethanol in combination with the hydrocarbon solvent, Soltrol ®50, 10 to 50% by weight of 2-butoxyethanol, is a preferred combination.

The procedure for applying the swelling agent to the imaged polymeric mask generally should be controlled to obtain a uniform swelling of the polymeric image and to prevent damage to the polymeric image, which is softened by the swelling action of the swelling agent. Ideally just sufficient swelling agent is needed to uniformly wet the image surface without either flooding it or applying tangential or compressive forces. However, since the rate of swelling of the agents of this invention is slower and can be repeated, uniformity can be insured by multiple applications. Any method may be used to uniformly apply the swelling agent to the image area provided the method does not flood the surface with too much liquid, and provided the method does not entail abrasive or compressive forces which would distort or mar the image.

A satisfactory method of applying the swelling agent is by lightly drawing across the image area the edge of a paint brush or other applicator such as a foraminous wick, soaked in swelling agent. If the image area is small this procedure might be accomplished with a small brush or a felt-tip pen. If the image area is large, a felt-edged squeegee of sufficient length might be used. In either case the swelling agent is supplied uniformly from the applicator to the image area and is absorbed into the image to enlarge the image dots. In place of felt, any foraminous material may be used such as paper, and woven and nonwoven fabrics. Similarly, the swelling agent may be applied as a mist, e.g., using an airbrush; or carefully coated as a liquid film.

INDUSTRIAL APPLICABILITY

The process of this invention is useful for color correction of images, e.g., line, halftone dot, etc., on photopolymer litho films. Permanent enlargement can be achieved in different degrees dependent on the strength of the treatment solution. Enlarged images can be further uniformly enlarged by an appliation of a more concentrated treatment solution. The photopolymer mask with enlarged images is primarily useful in making printing plates and particularly in lithographic plate masking, wherein a plurality of color separation masks is employed. Enlarging the size of the exposed areas is carried out to an extent such that a composite color image produced with the masks (on a lithographic plate or on a proofing film) has the desired tonal balance.

In a typical embodiment, a printer desiring to prepare full-color prints of an original color picture or transparency, would photographically break it down through the use of a copying camera and color lens filters which transmit only selected color light, to produce four color separation negatives, preferably yellow, magenta, cyan, and black. Each of these would be photographed through a halftone screen to produce a dot pattern on a screened positive, i.e., a halftone color separation mask. After exposure and development, the imaged masks would be used to produce a full color proof, e.g., by processes disclosed in Chu and Cohen U.S. Pat. No. 3,649,268 and Cohen and Fan U.S. Pat. No. 4,174,216. If the separation masks themselves are appropriately colored as disclosed in U.S. Pat. No. 4,173,673, supra, they may be assembled, one on top of the other in register, to yield a full color proof of the original. If the color reproduction of the proof was satisfactory, each imaged photomask could be used for exposing and processing a suitable photosensitive lithographic printing plate. The latter, when processed and inked with an ink corresponding in color to that represented by the photomask, would yield prints of that color. Multiple printing from four plates which have been exposed through each of the yellow, magenta, cyan, and black imaged masks, and inked accordingly, would yield a faithfully reproduced full-color print of the original picture or process transparency.

However, it may be observed that the full color proof is, for example, not yellow enough, not magenta enough, etc., either overall or in certain regions. In this instance, the imaged photomask corresponding to the color deficiency would be corrected by dot enlargement, either overall or locally by treating with the agent in accordance with this invention. Then a second full color proof would be obtained from the imaged and corrected photomasks and would be reinspected again. Further corrections would be made as necessary, until the full-color reproduction desired was obtained. When satisfactory, each mask could then be used as described in "Printing Industry" by Victor Strauss, supra, to produce printing plates of various types, particularly lithographic printing plates. The further process of printing from printing plates is conventional and is not a part of this invention.

EXAMPLES

The following examples illustrate the invention wherein the parts and percentages are by weight unless otherwise noted.

EXAMPLE 1

The following photopolymerizable composition was prepared:

| Ingredient | Amount (g) |
| --- | --- |
| Interpolymer formed from 40% N—tert-octyl acrylamide, 34% methyl methacrylate, 16% acrylic acid, 6% hydroxy propyl methacrylate, and 4% t-butylamino ethyl methacrylate; wt. ave. mol wt. ca. 50,000 | 428.0 |
| Trimethylol propane triacrylate | 160.0 |
| Titanium acetyl acetonate, 75% isopropanol solution | 18.0 |
| Sodium dioctyl sulfosuccinate | 18.0 |
| 4,4'-Bis(diethylamino) benzophenone (Michler's ketone) | 10.8 |
| 4,4'-Bis(diethylamino) benzophenone | 32.4 |
| 2,2'-Bis(2-chlorophenyl)-4,4',5,5'-tetrakis(m-methoxyphenyl)-biimidazole | 39.6 |
| 2,2'-Bis(2-chlorophenyl)-4,4',5,5'-tetraphenyl biimidazole | 39.6 |
| 2,2'-Dihydroxy-4-methoxy benzophenone | 18.0 |
| 2-(Stilbyl-4'')-naptho-1',2':4,5)-1,2,3-triazol-2''-sulfonic acid phenyl ester | 0.9 |
| 7-(4'-Chloro-6'-diethylamino-1',3',5'-triazine-4'-yl)amino-3-phenyl-coumarin | 18.0 |
| Polyethylene beads, ave. size about 2 micrometers | 36.0 |
| Monastral ® Blue G (C.I. Pigment Blue 15) | 114.0 |
| 2-Ethoxyethanol | 516.0 |
| Methylene chloride | 3831.0 |

The solution was coated at 50 mg/dm² on the coated side of polyethylene terephthalate film, 0.004 inch (0.01 cm) in thickness. The polyethylene terephthalate film was flame treated under conditions such that $$1.3 = \frac{5 \times \text{propane flow rate}}{[0.21 \times \text{Air Flow Rate}] + \text{oxygen Flow Rate}}$$

and subsequently coated with 0.05 mg/dm² layer of titanium acetyl acetonate (75% isopropanol solution). The photopolymerizable layer was overcoated with 15 mg/dm² of the following polyvinyl alcohol formulation prepared as indicated

| Ingredient | Parts by Weight |
| --- | --- |
| Solution A: | |
| Polyvinyl alcohol (13% in water), 98–98.8 hydrolysis; viscosity of 4% aqueous solution at 20° C. is 6–8 cps | 2840 |
| "FC-128" (fluorocarbon surfactant from 3M Co.) (5% in water) | 30 |
| Rice starch | 75 |
| "Misco" AC-392 (Polyethylene wax dispersed in water, Misco Products Co., Wheeling, Illinois (40% in water) | 434 |
| Colloidal silica (30% silica in aqueous medium) | 372 |
| Distilled water | 8920 |
| Solution B: | |
| Polyvinyl alcohol of Solution A | 85 |
| Corn starch | 15 |
| Distilled water | 248 |

Solution B was heated to approximately 150° F. (65.5° C.) for 15 minutes, cooled, and then added to Solution A to form a bulk solution.

| Solution C: | |
| --- | --- |
| Polyvinyl alcohol of Solution A | 324.4 |
| "FC-128" of Solution A | 3.3 |
| Rice starch | 8.3 |
| Corn starch | 21.0 |
| Colloidal silica of Solution A | 41.3 |
| Distilled water | 1129.0 |

Solution C was added at a rate of 1:10 to the bulk solution and immediately coated over the photopolymerizable layer.

The resulting film was imagewise exposed for 60 units (about 12 seconds) through a uniform 50% tint (positive percent dot area of standard ruled tint (halftone screen tint)) to the light from a Berkey-Ascor 30 inches by 40 inches (0.76 m by ~1.02 m) Vacuum Printer equipped with 2 kw mercury ("Photopolymer") lamp and an Addalux ® Proofing Filter to permit ultraviolet radiation between 320 and 380 nm to pass. The imaged film was spray developed at 95° F. (35° C.) with a developer composed of 840 g of K₂CO₃ and 50 g KHCO₃ in 16 liters water in an apparatus with a developer path length of about 3 inches (7.62 cm) at a processing speed of about 50 inches/minute (1.27 m/minute). A water spray at 95° F. (35° C.) was used followed by contra-rotating scrub belts whereby the unexposed areas of the film were removed. The developed film was given an overall exposure through the film base. This film is designated a "1st Generation Film" and had an ultraviolet densitomer reading of 0.34 corresponding to 54.4% dots.

Samples of the aforementioned developed film were treated with various solvents disclosed below and the density of the treated areas measured after evaporation of the solvent (Final Density) and the equivalent dot area (Final % Dot) was determined from the relationship $$\text{Final Density} = \log\left(\frac{100}{100 - \text{Final \% Dot}}\right)$$

The apparent increase in % dot resulting from the solvent treatment is "Δ% Dot".

The samples were then copied back onto negative-working film prepared as described in Example 1 of Bratt and Cohen U.S. Pat. No. 4,173,673 and is designated "2nd Generation Film". A 30 units (6 second) exposure with the above light source was used followed by development a 100 inches/minute (2.54 m/minute) in a Crona-Lite ® Model II processor (a product of E. I. du Pont de Nemours and Company). The ultraviolet densities corresponding to the original tint and to the enlarged areas were read. The change in dot size "Δ% Dot" in the 2nd Generation Film was calculated. The aforementioned values for the samples are set forth in Table 1.

TABLE 1

| Sample | Solvent | 1st GENERATION FILM | | | Original Density | % Dot | 2nd GENERATION FILM | | |
|---|---|---|---|---|---|---|---|---|---|
| | | Density | Final % Dot | Δ % Dot | | | Final Density | Final % Dot | Δ % Dot |
| 1 | 2-Ethoxyethanol | 1.12 | 92.4 | 38.0 | 0.31 | 51 | 0.08 | 16.9 | 34.1 |
| 2 | 2-Methoxyethanol | 0.90 | 87.4 | 33.0 | 0.31 | 51 | 0.14 | 27.6 | 23.4 |
| 3 | 2-Butoxyethanol | 0.74 | 81.9 | 27.5 | 0.31 | 51 | 0.18 | 34.0 | 17.0 |
| 4 | Methanol | 0.43 | 62.9 | 8.5 | 0.31 | 51 | 0.27 | 46.3 | 4.7 |
| 5 | Ethanol | 0.59 | 74.4 | 20.0 | 0.33 | 53.3 | 0.24 | 42.5 | 10.8 |
| 6 | Butanol | 0.54 | 71.2 | 16.8 | 0.33 | 53.3 | 0.26 | 45.1 | 8.2 |
| 7 | Isopropanol | 0.57 | 73.1 | 18.7 | 0.30 | 50 | 0.23 | 41.1 | 8.9 |
| 8 | Acetone | 0.40 | 60.2 | 5.8 | 0.31 | 51 | 0.28 | 47.5 | 3.5 |
| 9 | Methyl ethyl ketone | 0.49 | 67.7 | 13.3 | 0.31 | 51 | 0.24 | 42.5 | 8.5 |
| 10 | Cyclohexanone | 0.60 | 75.0 | 20.6 | 0.31 | 51 | 0.19 | 35.5 | 15.5 |
| 11 | Ethyl acetate | 0.41 | 61.1 | 6.7 | 0.31 | 51 | 0.26 | 43.9 | 7.1 |

The Δ% Dot Values for the "1st Generation Film" are generally higher than the corresponding Δ% Dot Values for the "2nd Generation Film". The difference is believed to be due to optical absorbers leached from the 1st generation film by the swelling agent and deposited in clear areas between dots. While the deposits affect the density measurement of the 1st generation film, they do not significantly affect transmitted actinic radiation used to produce the 2nd generation film. Consequently, the 2nd generation film Δ% Dot measurement is a true measurement of dot enlargement.

EXAMPLE 2

Example 1 was repeated using the following 2-butoxyethanol diluent mixtures:

| Mixture A | | |
|---|---|---|
| 2-Butoxyethanol (%) | Diluent Water % | Δ% Dot 2nd Generation Film |
| 100 | 0 | 33.5 |
| 50 | 50 | 36.0 |
| 25 | 75* | 14.7 |

*The coating of this solution was not uniform but was capable of being improved by the presence of a wetting agent.

| Mixture B | | | |
|---|---|---|---|
| 2-Butoxyethanol (%) | Diluent (%) Aliphatic Hydrocarbon** | Δ% Dot Enlargement (50% dots) | |
| | | 1st Generation | 2nd Generation |
| 20 | 80 | 3 | 2 |
| 35 | 65 | 6 | 7 |
| 50 | 50 | 13 | 1 |
| 20 then 50 | 80 then 50 | 14 | 15 |

**The aliphatic hydrocarbon is a mixture of C₈₋₁₀ 150-paraffins with a boiling point range of 116–149° C.

The use of Mixture A reflects the moderating effect of a diluent on the extent of dot enlargement for a single swelling agent.

The solvent/diluent of Mixture B was applied by brush with multiple strokes to image areas outlined with Scotch Brand (3M Co.) Lithographic Tape No. 616. After the solvent/diluent was applied it was allowed to stand for several minutes followed by complete drying with a hot air gun. The copying of the enlarged image to form the 2nd Generation Film was accomplished by exposing for 30 units (6 seconds) in the exposure device described in Example 1 and developing. Good enlarged dot quality and excellent uniformity over large areas was achieved. In addition, the similarity of Δ% Dot for 1st and 2nd generation films indicates the absence of leached deposits on 1st generation film.

EXAMPLE 3

A photopolymerizable composition was prepared by mixing the following ingredients:

| Ingredient | Amount (g) |
|---|---|
| Interpolymer formed from 40% N—tert-octyl acrylamide, 34% methyl methacrylate, 16% acrylic acid, 6% hydroxy propyl methacrylate, and 4% t-butylamino ethyl methacrylate; wt. ave. mol wt. ca. 50,000 | 710.0 |
| Trimethylol propane triacrylate | 300.0 |
| Sodium dioctyl sulfosuccinate | 30.0 |
| 4,4'-Bis(diethylamino) benzophenone (Michler's ketone) | 21.6 |
| 4,4'-Bis(diethylamino) benzophenone | 64.8 |
| 2,2'-Bis(2-chlorophenyl)-4,4',5,5'-tetrakis(m-methoxyphenyl)-biimidazole | 66.0 |
| 2,2'-Bis(2-chlorophenyl)-4,4',5,5'-tetraphenyl biimidazole | 66.0 |
| 2,2'-Dihydroxy-4-methoxy benzophenone | 36.0 |
| 2-(Stilbyl-4")-napto-1',2':4,5)-1,2,3-triazol-2"-sulfonic acid phenyl ester | 1.5 |
| 7-(4'-Chloro-6'-diethylamino-1',3',5'-triazine-4'-yl)amino-3-phenyl-coumarin | 36.0 |
| Polyethylene oxide [Polyox ® WSR N-3000] | 9.0 |
| Monastral ® Blue G (C.I. Pigment Blue 15) | 195.0 |
| 2-Ethoxyethanol | 790.0 |
| Methanol | 150.0 |
| Methylene chloride | 5284.0 |

The solution was coated at 50 mg/dm² on flame-treated polyethylene terephthalate film, 0.004 inch (0.10 mm) in thickness as described in Example 1, and was overcoated with the polyvinyl alcohol based formulation as described in Example 1. The resulting film was image exposed for 50 units (about 10 seconds) through a uniform 50% tint to the exposure source described in Example 1. The imaged film was developed as described in Example 1 at a processing speed of 65 inches/minute (1.65 m/minute). The results of film samples treated with 2-butoxyethanol in combination with various diluents is set forth in Table 2 as follows:

TABLE 2

| Sample | 2-Butoxy-ethanol (%) | Diluent | Original Density | % Dot | 1st GENERATION FILM | | | Original Density | % Dot | 2nd GENERATION FILM | | |
|---|---|---|---|---|---|---|---|---|---|---|---|---|
| | | | | | Final Density | Final % Dot | Δ % Dot | | | Final Density | Final % Dot | Δ % Dot |
| 1 | 25 | Soltrol ® 50 | 0.35 | 55 | 0.57 | 73 | 18 | 0.30 | 50 | 0.14 | 28 | 22 |
| 2 | 13 | Hexane | 0.35 | 55 | 0.52 | 70 | 15 | 0.29 | 49 | 0.16 | 31 | 18 |
| 3 | 20 | Cyclohexane | 0.35 | 55 | 0.49 | 68 | 13 | 0.30 | 50 | 0.20 | 37 | 13 |
| 4 | 10 | Dichloroethane | 0.35 | 55 | 0.39 | 59 | 4 | 0.30 | 50 | 0.26 | 45 | 5 |
| 5 | 20 | Heptane | 0.35 | 55 | 0.51 | 69 | 14 | 0.32 | 52 | 0.19 | 36 | 16 |

Good enlarged dot quality and excellent uniformity over large areas was achieved using each of the diluents with little or no leached deposits in the 1st generation film.

We claim:

1. Process of enlarging the image area covered by a stencil or relief image area formed in a photopolymer mask which process consists essentially of
   (a) contacting the image area with a swelling agent therefor in the absence of a separate crosslinking agent to effect an equilibrated image enlargement, and
   (b) removing excess swelling agent whereby the equilibrated image is fixed in its enlarged state.

2. Process according to claim 1 wherein the steps of contacting the image area with a swelling agent therefor and removing excess swelling agent are repeated at least one time, the swelling agent being more concentrated than in the preceding contacting step.

3. Process according to claim 1 wherein the swelling agent is at least one member of the group consisting of 2-methoxyethanol, 2-ethoxyethanol, 2-butoxyethanol, methanol, ethanol, butanol, isopropanol, acetone, methyl ethyl ketone, cyclohexanone and ethyl acetate.

4. Process according to claim 1 wherein the image areas are contacted with a combination of swelling agent and diluent.

5. Process according to claim 4 wherein the diluent has a boiling point below 150° C.

6. Process according to claim 4 wherein the ratio of swelling agent/diluent ranges from 10/90 to 100/0.

7. A process according to claim 1 wherein the swelling agent is removed by evaporation.

8. A process according to claim 1 wherein the swelling agent is removed by air impingement.

9. A process according to claim 8 wherein the impinging air is heated.

10. A process according to claim 1 wherein the swelling agent is removed from the equilibrated enlarged image by treating with a diluent nonswelling agent.

11. A process according to claim 1 wherein the image formed in the photopolymer mask is one selected from the group consisting of a halftone image, engineering drawing, and a printed circuit pattern.

12. A process according to claim 1 wherein the relief image formed in the photopolymer mask consists of hardened upper skins which rest on softer under-volumes having a lesser degree of polymerization or hardening.

13. In a process of image reproduction which comprises (1) imagewise exposing to actinic radiation through a transparency a film consisting essentially of a photopolymerizable layer coated on a transparent support, whereby the exposed areas polymerize and harden, and (2) developing said film by removing the unexposed areas of the layer with a solvent so as to leave a dot image mask on the support, the improvement which consists essentially of (a) contacting the dot image mask with a swelling agent in the absence of a separate crosslinking agent to effect an equilibrated image enlargement, and (b) removing excess swelling agent whereby the equilibrated image mask is fixed in its enlarged state.

14. Process according to claim 13 wherein the imagewise exposing is through a continuous tone original and a vignetted halftone screen.

15. Process according to claim 13 wherein the imagewise exposing and development steps produce one of a plurality of color separation masks, and the dot enlargement is carried out to an extent such that a composite color image produced with the several masks has the desired tonal balance.

16. Process according to claim 15 wherein each of the color separation masks has been exposed through a different color separation negative and has been colored in a spectral region corresponding to the color separation negative.

17. Process according to claim 16 wherein the masks and color separation negatives correspond, respectively, to yellow, magenta, cyan, and black.

18. A process according to claim 13 wherein the photopolymerizable layer consists essentially of a. an ethylenically unsaturated monomer capable of forming a high molecular weight polymer by free radical-initiated, chain-propagating, addition polymerization, 10–30% by weight;

b. a polymeric binder, 10–60% by weight;

c. a free radical-generating addition polymerization initiator system activatable by actinic radiation, 0.1–20% by weight, and, d. an actinic radiation-absorber, present in such concentration as to impart an optical density to the photopolymerizable layer of at least 3.0 over at least the spectral range of 350–400 nm.

19. Process according to claim 13 wherein the dot image mask of step 2(A) is contacted with a combination of swelling agent and diluent.

* * * * *